United States Patent
Brede et al.

(10) Patent No.: US 7,072,233 B2
(45) Date of Patent: Jul. 4, 2006

(54) METHOD AND APPARATUS FOR OPTIMIZING THE FUNCTIONING OF DRAM MEMORY ELEMENTS

(75) Inventors: Ruediger Brede, Hoehenkirchen (DE); Dominique Savignac, Ismaning (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 10/850,817

(22) Filed: May 21, 2004

(65) Prior Publication Data

US 2005/0002245 A1    Jan. 6, 2005

(30) Foreign Application Priority Data

May 22, 2003  (DE)  ............................... 103 23 237

(51) Int. Cl.
*G11C 29/00*    (2006.01)
*G11C 7/00*    (2006.01)

(52) U.S. Cl. ................... 365/201; 365/96; 365/230.06; 365/203

(58) Field of Classification Search ................ 365/201, 365/96, 230.06, 203
See application file for complete search history.

(56) References Cited

U.S. PATENT DOCUMENTS

| | | | | |
|---|---|---|---|---|
| 4,575,815 A | | 3/1986 | Delahunt | |
| 4,669,082 A | * | 5/1987 | Tilghman et al. | 365/201 |
| 5,357,471 A | * | 10/1994 | Alapat | 365/96 |
| 5,946,248 A | * | 8/1999 | Chien et al. | 365/201 |
| 2002/0048191 A1 | | 4/2002 | Ikehashi et al. | |

FOREIGN PATENT DOCUMENTS

DE    33 33 862 C2    4/1984

* cited by examiner

Primary Examiner—Huan Hoang
(74) Attorney, Agent, or Firm—Slater & Matsil, L.L.P.

(57) ABSTRACT

In the method for modifying a default time duration between an execution instant of a second operation and an earlier execution instant of a first operation executed earlier in a memory element, wherein the memory element is operable in a test operation mode and a normal operation mode, at first a real time duration in the memory element is determined and provided during the test operation mode, wherein the real time duration is chosen so that a performance parameter of the memory element, when using the real time duration between the execution instants of the first and second operations, improves over a situation in which the default time duration between the execution instants of the first and second operations is used. Then, the default time duration is changed in direction of the real time duration during the test operation mode to obtain a modified default time duration. Then information on the modified default time duration or on the ascertained real time duration are stored in the memory element during the test operation mode, wherein the second operation is executed offset by the modified default time duration after the execution instant of the first operation during the normal operation mode.

25 Claims, 8 Drawing Sheets

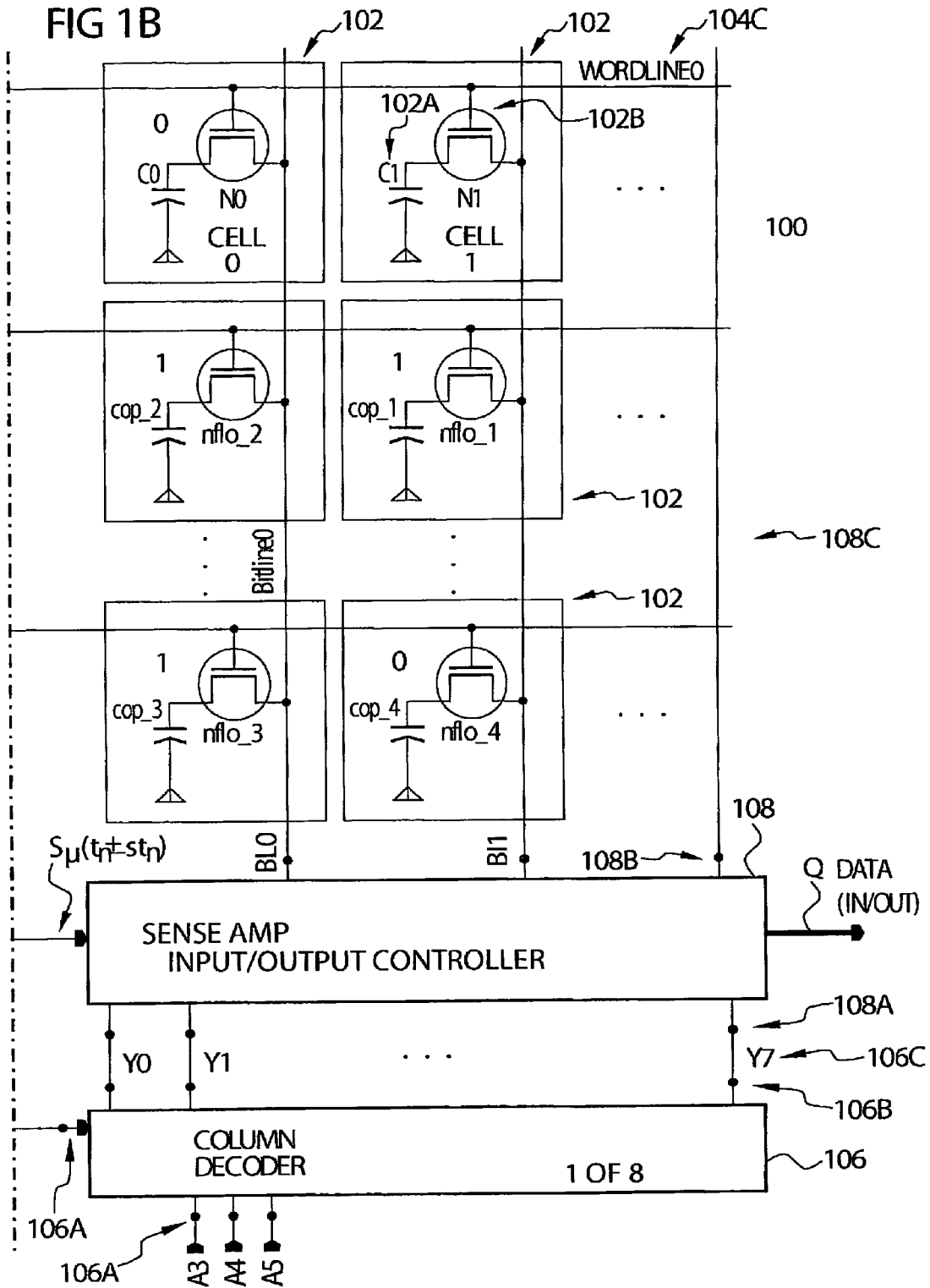

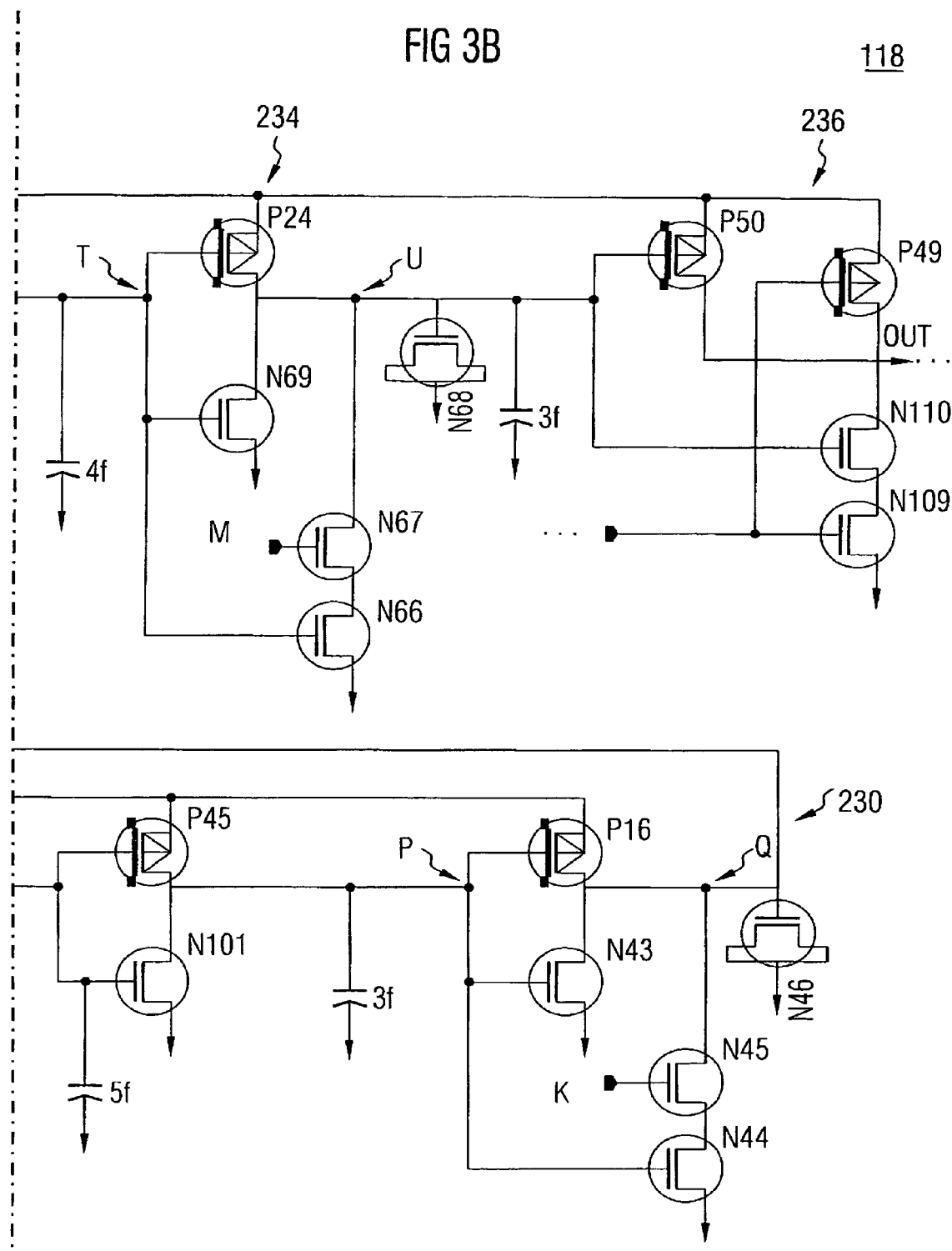

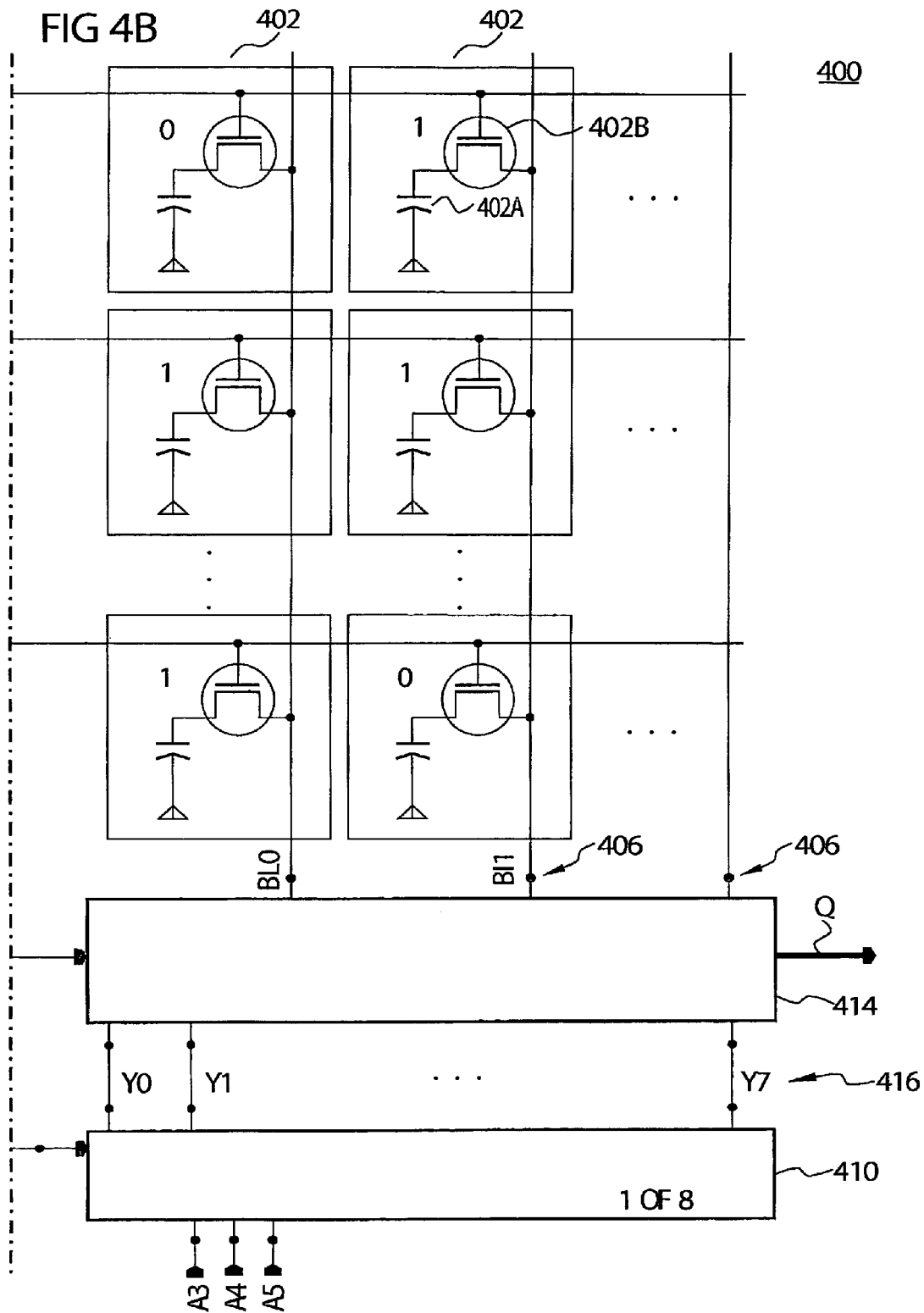

METHOD AND APPARATUS FOR OPTIMIZING THE FUNCTIONING OF DRAM MEMORY ELEMENTS

BACKGROUND OF THE INVENTION

1. Field of the Invention

The present invention relates to memory elements, and in particular to an apparatus and a method for optimizing the functioning of memory elements, and to DRAM memory devices using such an apparatus or such a method for optimizing their functioning.

2. Description of the Related Art

Today DRAM memory devices are employed in a multiplicity of electronic devices, with DRAM memory devices being used in particular as system memories or main memories of computer systems. In this, the DRAM memory devices play a very great role for the efficiency and stability of the computer systems.

DRAM memory devices (DRAM=dynamic random access memory) comprise a multiplicity of dynamic memory cells that are generally very simply constructed. A dynamic memory cell often consists of a selection transistor controllable via a word line and a storage capacitor readable and writeable via a bit line. The memory states "0" and "1" of the memory cell correspond to the positive and negative charge state of the storage capacitor, respectively. Since the capacitor charge in the memory cells decays within a relatively short period of time owing to recombination processes and leakage currents, the capacitor charge always has to be refreshed again in so-called refresh cycles. After a read operation information also has to be written into the memory cell again. The refresh operation takes places automatically with the analog image data of a circuit integrated on the memory device.

Because of its simple construction, the dynamic memory cell is also very inexpensive for DRAM memory devices. The working or mass memories of today's computers from the PC (personal computer) to the mainframe computer therefore mostly consist of DRAM memory devices.

According to the designation DRAM memory device (DRAM=dynamic random access memory), in a write-read memory, data may be arbitrarily stored and read out again in form of single bits or bit patterns. FIG. 4 now schematically shows an exemplary construction of a 64-bit memory element 400 with matrix-shaped arrangement of the DRAM memory cells 402 that may each accommodate a bit. In FIG. 4 the memory contents are entered in arbitrary distribution as "zeros" and "ones". By means of a control logic circuit 412, a row and column decoder 408, 410 and a sense amplifier 414, the memory cells 402 may be addressed individually with an address $A_0, A_1, \ldots A_n$ via word lines 404 (x0–x7) and bit lines 406 (BL0–BL7) operative as row and column activation lines. It should be noted that the circuit block 414 designated as sense amplifier further comprises an input/output controller for associating a data stream with reference to the individual memory cells 402, wherein this circuit block consisting of sense amplifier and input/output controller is further designated as sense amplifier 414 for simplification of the further description.

In the construction illustrated in FIG. 4 of a known DRAM memory device 400, the sense amplifier 414 is controlled by the column decoder 410 via the lines 416 (y1–y7) and by the control logic circuit 412 to adjust the write or read operation of the sense amplifier 414 with reference to the individual bit lines 406.

As can further be seen from FIG. 4, the DRAM memory cells 402 comprise two main components, namely a storage capacitor 402a storing charge and an access transistor 402b transferring the charge into the storage capacitor 402a and out of it.

In order to now write data into the memory cell 402, a predetermined voltage is applied to the corresponding word line 404 (x0–x7) so that the access transistor 402b connected to this word line 404 becomes conducting. With this, the charge supplied through the associated bit line 406 is written into the storage capacitor 402a.

In reading data a predetermined voltage is again applied to the word line 404 to connect the access transistor 402b through, so that the charge stored in the storage capacitor 402a may be read out on the associated bit line 406.

Via the control logic means 412, the DRAM memory device 400 may selectively be adjusted to write or read operation. The addressed memory cell 402 may be written with a "1" or a "0" via bit lines 406. At the output Q of the sense amplifier 414 (consisting of sense amplifier and input/output controller) connected to the individual memory cells 402 via the bit lines 406, the content of the memory cells 402 is readable. The input signals of the control logic means 412 are explained in even greater detail in the following on the basis of FIG. 5.

It should be noted that individual circuit parts, such as the control logic means 412, may be implemented differently in the individual case depending on technology, e.g. in BiCMOS or CMOS technology.

An important parameter for the characterization of the efficiency of such a DRAM memory device 400 represents its "access time" also designated as maximum access time. The access time is, according to definition, the time span between the instant of applying the address of the memory cell 402 and the instant of the appearing of the stored data at the output Q of the memory device 400. The access time is substantially due to device-internal signal runtimes and is held to be the characteristic quantity of a DRAM memory device.

FIG. 5 now schematically shows a time diagram for a typical access cycle of a DRAM memory device. In the timing diagram of FIG. 5, the instants $t_1$–$t_5$ indicating the execution instants of various operations of the DRAM memory element are illustrated in a purely schematic manner. The illustrated instants $t_1$–$t_5$ are only intended to serve for the fundamental explanation of the course of a DRAM access cycle and not to illustrate actual size ratios.

In a DRAM access cycle, substantially the following main operations exist. At the instant $t_1$ the DRAM memory cell begins with the execution of a row active operation. At the instant $t_2$, the DRAM memory cell begins executing a read/write command, i.e. a system memory control unit sends a read/write command to the DRAM memory cell. At the instant $t_3$, the DRAM memory cell sends the required data outside. At the instant $t_4$, the DRAM memory cell begins executing the preload operation. At the instant $t_5$, the DRAM memory cell for example executes the row active operation for the next access cycle to the DRAM memory cell.

These parameters are fixedly default by the circuit layout and the production process of the memory element 400.

With respect to the time diagram schematically illustrated in FIG. 5, various time intervals between the execution instants of various operations of the memory device are defined as follows, wherein these time intervals are also designated in the following as timing parameters of the DRAM memory devices. The time intervals may for example be related to the system clock CK of the memory element 400.

The time interval between the beginning of an execution of a row active operation and the beginning of an execution of a read/write command is designated as the time interval $T_{RCD}$ and indicates the delay between a row address activation impulse (RAS) at the instant $t_1$ and a column address activation impulse (CAS) at the instant $t_2$, i.e. the time duration $T_{RCD}=t_2-t_1$. The time interval $T_{RCD}$ thus represents one of the substantial timing parameters of DRAM memory devices, because the temporal distance between the activation of a word line (ACTIVE) and the subsequent read or write access command (READ or WRITE operation) of the memory cell is determined.

The refresh interval is indirectly dependent on the timing parameter $T_{RCD}$, wherein according to the refresh interval each DRAM memory cell has to be refreshed to be brought to its full voltage value again. The retention time of a DRAM memory element now indicates the time span across which the DRAM memory cells can hold enough charge so that a correct read operation is possible. So the refresh interval is default by the retention time of a DRAM memory element.

The clock number during the time interval starting from the sending of a read command at the instant $t_2$ to the DRAM memory cell until the outputting of the required data at the instant $t_3$ from the DRAM memory cell is defined as CAS latency time and is designated as the time duration $T_{CL}=t_3-t_2$.

The time interval from the beginning of a row active operation at the instant $t_1$ until the beginning of a preload operation at the instant $t_4$ is defined as the RAS impulse width time and is designated as the time interval $T_{RAS}$. The time interval $T_{RAS}$ thus determines the temporal distance between the activation of a word line (ACTIVE operation) and the deactivation of this word line (PRECHARGE operation). The time interval $T_{RAS}$ is thus strongly linked to the timing parameters $T_{RCD}$ and $T_{RP}$.

The time interval measured from the beginning of a precharge operation at the instant $t_4$ until the beginning of the next row active operation at the instant $t_5$ is defined as row precharge time and is designated as the time interval $T_{RP}$. The $T_{RP}$ time interval thus determines the temporal distance between the activation of a word line (PRECHARGE operation) and a subsequent activation of a word line (ACTIVE operation) in the same memory bank.

Since the above-described timing parameters possess decisive influence on the performance characteristics of DRAM memory cells, such as on the access times of DRAM memory devices, in the production of DRAM memory devices great efforts are made to adjust these timing parameters, $T_{RCD}$, $T_{RAS}$, $T_{RP}$, $T_{CL}$, . . . as optimally as possible to be able to correspondingly increase the efficiency of the DRAM memory devices and thus also the efficiency of the computer systems using these memory devices.

In order to obtain the optimum timing parameters, the optimally obtainable real timing parameters of a DRAM memory device are for example ascertained in a test mode of the memory element in order to then adapt the circuit layout of the memory device to the timing parameters deemed optimal. For this, in the prior art various test apparatuses with special check programs are provided.

Improved timing parameters are obtained by fixedly adjusting the desired timing parameters by means of a specially designed metal option so that the specially adjusted timing parameters are fixedly linked to the respective circuit layout of the memory device.

The circuit layout of a DRAM memory element for example comprises various metal planes with different potentials, e.g. supply voltages, ground potential, and optionally also intermediate potentials. By a change of the circuit layout of the DRAM memory element, a special, new, fixed wiring of certain circuit elements of the control logic means of the DRAM memory element that have an influence on a timing parameter with the various metal planes is produced to influence a certain timing parameter so as to obtain a suitably adjusted, new timing parameter. This procedure is generally designated as the use of a new metal reticle (Metall1, Metall2) for the DRAM memory element.

But since the production processes of semiconductor devices are subject to constant variations, corresponding changes and variations also constantly result for the optimum adjusting points of the explained timing parameters of the memory devices. In order to now react to such variations in the semiconductor production processes and to be able to compensate for these at least partially, in working with a new metal option, a new reticle for the semiconductor production process has to be written, wherein the hardware has to pass through diverse procedural machining steps. This may however require months until a semiconductor device is ready to go into mass production. This makes clear that with the previously used metal options it can be reacted to variations in the semiconductor production processes only with a very great time delay and high technical expenditure.

Due to the inevitable variations in the production processes of semiconductor memory devices it is, however, not possible to adjust the (instantaneously optimal) timing parameter exactly for the normal operation of the semiconductor device, because between a test operation mode during which the optimal timing parameters may be ascertained and the production of new hardware with optimized timing parameters, as it is explained above, a very long time elapses. Therefore the timing parameters generally no longer optimal, ascertained in the long passed test mode of the semiconductor device underlie the instantaneous operation of the semiconductor device.

In order for the functioning of the DRAM memory device not to be affected by the inevitably occurring variations of an operation parameter of the semiconductor memory device, certain "safety time reserves" are provided for the respective timing parameters to guarantee reliable operability of the semiconductor devices. If the safety time reserves for the timing parameters are adjusted too short to, for example, produce semiconductor memory devices with very short access times lying very close to the timing parameters ascertained in the test mode, in practice, however, a relatively high reject quota of defective semiconductor memory devices to be sorted out will result due to the inevitable variations in the semiconductor production processes. For this reason, the respective optimal timing parameters of a DRAM memory device may not exactly be realized in large batch production processes.

Summing up, it can thus be established that in the prior art it has previously been extremely expensive to account for changed timing parameters of the DRAM memory devices due to variations in the production processes, because the reaction time duration for performing adaptations of the circuit layout of memory devices may lie in the area of several months. For this reason, relatively great safety reserves for the timing parameters of memory devices are made to keep the reject quota of defective memory devices as low as possible. Furthermore, the establishment of a new circuit layout for memory devices adapted to production process variations is very expensive, because in general a new reticle has to be produced for each new circuit layout, and the semiconductor device has to pass through a multiplicity of procedural machining steps.

SUMMARY OF THE INVENTION

Starting from this prior art, in one aspect, the present invention provides an improved concept for simpler and quicker adaptation of the timing parameters of semiconductor memory devices.

In accordance with a first aspect, the present invention provides a method for modifying a default time duration between an execution instant of a second operation and the earlier execution instant of a first operation executed earlier in a memory element, wherein the memory element is operable in a test operation mode and a normal operation mode, with the steps of: providing a real time duration in the memory element during the test operation mode, wherein the real time duration is chosen so that a performance parameter of the memory element, when using the real time duration between the execution instants of the first and second operation, improves over a situation in which the default time duration between the execution instants of the first and second operation is used, changing the default time duration in direction of the real time duration during the test operation mode to obtain a modified default time duration, storing information on the modified default time duration in the memory element during the test operation mode, and executing the second operation offset by the modified default time duration after the execution instant of the first operation during the normal operation mode.

In accordance with a second aspect, the present invention provides a semiconductor memory element with a plurality of memory cells and control logic means for controlling execution instants of operations of the semiconductor memory element, having: means for providing a modified default time duration between an execution instant of a second operation and an earlier execution instant of a first operation executed earlier in the memory element depending on an ascertained real time duration in the memory element, wherein the real time duration is chosen so that a performance parameter of the memory element, when using the ascertained real time duration between the execution instants of the first and second operations, improves over a situation in which the default time duration between the execution instants of the first and second operations is used, and wherein information on the modified default time duration is stored in the means for providing a modified default time duration.

The inventive method for modifying a default time duration between an execution instant of a second operation and the earlier execution instant of a first operation executed earlier in a memory element, wherein the memory element is operable in a test operation mode and a normal operation mode, includes the step of providing a real time duration in the memory element during the test operation mode, wherein the real time duration is chosen so that a performance parameter of the memory element when using the real time duration between the execution instants of the first and second operations improves over a situation in which the default time duration between the execution instants of the first and second operations is used, the step of changing the default time duration in direction of the real time duration during the test operation mode to obtain a modified default time duration, the step of storing information on the ascertained real time duration in the memory element during the test operation mode, and the step of executing the second operation offset by the modified default time duration after the execution instant of the first operation during the normal operation mode.

The inventive semiconductor memory element includes a plurality of memory cells and a control logic means for controlling execution instants of operations of the semiconductor memory element, and also means for providing a modified default time duration between an execution instant of a second operation and the earlier execution instant of a first operation executed earlier in the memory element dependent on an ascertained real time duration in the memory element, wherein the real time duration is chosen so that a performance parameter of the memory element when using the ascertained real time duration between the execution instants of the first and second operations improves over a situation in which the default time duration between the execution instants of the first and second operations is used, and wherein information on the modified default time duration is stored in the means for providing a modified default time duration.

The present invention is based on the finding to be able to operate a memory element, such as a DRAM memory element, in a test operation mode and a normal operation mode, wherein in a test operation mode of the memory element an improved or optimized execution instant of one or more operations of the memory element may be ascertained and correspondingly adjusted to suitably change (i.e. improve) a performance or function parameter of the memory element. The information on the ascertained and adapted execution instant or information on the change to be made of the execution instant of the operation to be optimized of the memory element is then stored in a read-only memory associated with the memory element, which is preferably formed by one or more fuse circuit(s).

The information ascertained during the test operation mode and stored in the read-only memory associated with the memory element are then used during the normal operation mode of the memory element to influence the memory element or logic circuits associated with the memory element to change the actual execution instants of the operation(s) of the memory element in direction of the ascertained, instantaneously optimal execution instant of the respective operation, so that a function parameter of the semiconductor memory device changes suitably.

By the inventive change of an execution instant of an operation (or more operations) of a DRAM memory element, certain time intervals are suitably changed that are designated as so-called timing parameters of the memory element. Some of the substantial operations of a memory element are here the activation of a word line of the memory element, the read/write access to the memory element, the switching on of a sense amplifier for the bit line signals, the deactivation of the word line (PRECHARGE), the writing back of the memory information into the memory element, and the activation of a word line (ACTIVE) in the same memory bank for the next access operation.

The use of memory elements, above all of DRAM memory elements, with associated read-only memory circuits for the adjustment of one or also more timing parameters of the memory element, in particular after previous ascertaining the optimized adjustment thereof in a test operation mode, enables significantly faster, more accurate, more flexible and cheaper adjustment of the timing parameters and the so-called retention time of a memory element than this has previously been possible with the procedures customary in the prior art, such as with so-called metal options.

Faster adjustment possibility of a function parameter of the memory element by means of a change of a timing parameter of the memory device inventively results from the required information being stored in a read-only memory, preferably in form of a fuse circuit, during the test operation mode of the memory element, wherein the information may be ascertained and suitably stored in a short time. In the case of fuse circuits as read-only memories, this information may be stored within seconds, such as by "fusing" or "shooting" (cutting out) the fuse elements. Here, for example unchanged fuse elements are associated with a first logic value, wherein "fused" fuse elements are associated with a second logic value.

Here, it is extremely advantageous in the inventive concept that an improved or optimized execution instant of one or more operations of the memory element may be ascertained still on wafer level during the test operation mode of the memory element by means of semiconductor device testing means, such as in form of a wafer tester. By means of the wafer tester, which is for example embodied as a needle tester (needle card), the usual DRAM function tests may be performed still on wafer level after the procedural production of the semiconductor devices. In these DRAM function tests, for example in a needle tester, test routines with the integrated semiconductor circuits are performed at default contact pads on the semiconductor wafer by means of various probe tips, to ascertain defective semiconductor circuits, such as defective DRAM memory cells. These DRAM memory cells ascertained as defective may then be replaced by redundant memory cells arranged on the semiconductor wafer. For this, for example connections on the wafer are cut out by means of a laser beam source to deactivate defective DRAM memory cells and to activate redundant, functional DRAM memory cells as replacement.

During the examination of the semiconductor circuit (DRAM memory cells) arranged on the semiconductor wafer, according to the invention, now also the test operation mode according to the inventive concept with regard to the memory elements may be performed by ascertaining the improved or optimal timing parameters, i.e. execution instants of the various operations, of the semiconductor memory elements by means of suitable hardware arrangements or software programs in the wafer tester. During the normal test operation of the wafer tester, additional test programs may be executed with the wafer tester to ascertain the optimal timing parameter for the memory cells.

The information ascertained by the wafer tester with reference to improved or optimal timing parameters of the individual memory elements may now for example be stored in a read-only memory associated with the memory element, wherein a fuse element is preferably associated with the read-only memory. The memory content of the fuse element may for example be changed by means of a laser by cutting out the fuse element. The programming of the read-only memory may thus be preferably performed concurrently with the step in the production of the semiconductor devices, in which defective semiconductor memory cells are replaced by redundant semiconductor memory cells by means of a laser.

It is thus extremely advantageous in the present invention that the steps of the ascertaining of the improved execution instants of the timing parameters of the memory elements and the storing of the information on the modified default time duration in an associated read-only memory in form of fuse elements may be performed in connection with the operation of a wafer tester for examining semiconductor devices.

With the present invention it is also possible to adjust the function parameters of a memory element in form of the timing parameters significantly more accurately than this has previously been possible with procedures known in the prior art.

At it is known, the production processes of semiconductor circuits, such as of DRAM semiconductor memory elements, are subject to constant variations, whereby also the optimal adjusting points of the function parameters of these semiconductor memory elements constantly change. With this so-called metal options previously customary in the prior art, in which a new reticle is required and a correspondingly newly designed hardware would have to pass through diverse procedural machining steps, it can only be reacted to such variations in the production processes in an extremely slow manner.

In contrast to this, with the present invention each variation in the production processes of semiconductor memory devices may be taken into account. With the present invention, changes of the optimal function parameters of a memory element occurring for example due to variations in the semiconductor production processes may be ascertained immediately, wherein by means of the inventive concept it may be reacted immediately to these changes, and these variations may be compensated for.

Thus, significantly more flexible adjustment of the respective function parameter of a memory element is also possible. In the extreme case, with the read-only memories associated with the memory element and preferably being present in form of fuse circuits, every individual DRAM memory element may be optimally adjusted with reference to its function parameters, timing parameters, etc. after a previous test operation mode, which is, in principle, obviously impossible with the metal options previously employed in the prior art.

If such a procedure in which the timing parameters of every individual DRAM memory element are adjusted optimally turns out to be too test-intensive in practice, it may of course also be passed on to ascertain the optimal parameter adjustment of the DRAM memory elements in freely selectable time spacings, i.e. for example hourly, daily, weekly, etc., and to store it correspondingly in the read-only memory associated with the DRAM memory element. This storage of the information will then preferably take place by a so-called "fusing" of the fuse elements.

A further, especially advantageous effect of the storage of the optimal parameter adjustment of a DRAM memory element in an associated read-only memory is that also the mutual interaction of the various parameters, e.g. the timing parameters and the retention time, may be taken into account among each other and be tuned to each other.

If for example during the test operation mode modified execution instants for the operations of the so-called $T_{RCD}$ timing parameter are ascertained, i.e. if it is for example possible to make the read access operation of a DRAM memory element earlier, which corresponds to an improved $T_{RCD}$ timing parameter, then also the cell information is thereby again written back into the cell earlier, so that also in a subsequent "PRECHARGE command" the word line may be deactivated more quickly. Thus, during the test operation mode of the DRAM memory element, the optimal word line switch-off time may also be ascertained, so that the $T_{RP}$ timing parameter of the DRAM memory element may be improved.

Of course it is also possible, if the DRAM memory element comprises a clearly better $T_{RCD}$ timing parameter than the value aimed at, to switch on the sense amplifier of the DRAM memory element slightly later, i.e. the $T_{RCD}$ timing parameter "deteriorates" slightly, but is still better than the value aimed at, but whereby the cell content stored in the memory cell of a DRAM memory element may be read out better and thus the retention time of the DRAM memory element may be improved.

It thus becomes obvious that in the present invention the optimization of the individual function parameters of the DRAM memory element may also be weighed so as to change and improve the overall performance of the DRAM memory element, wherein of course only an individual relevant function parameter of the DRAM memory element may also be changed.

Furthermore, it becomes obvious that by the present invention the optimized adjustment of the function parameters of a DRAM memory element may be made significantly cheaper than it is possible with the so-called metal options previously required in the prior art, in which for each new adjustment of an operation parameter a completely new production process with diverse procedural steps has to be passed through.

It should, however, also become obvious that one of the greatest advantages in the present invention results from the tremendous temporal advantage with which it may be reacted to variations in the production processes of semiconductor memory elements, wherein this of course also has an economically extremely beneficial influence on production cost.

BRIEF DESCRIPTION OF THE DRAWINGS

These and other objects and features of the present invention will become clear from the following description taken in conjunction with the accompanying drawings, in which:

FIG. 4B shows a principle illustration of a circuit construction of a typical DRAM memory element with control logic means according to the prior art.

DESCRIPTION OF THE PREFERRED EMBODIMENTS

In the following, the inventive concept for modifying a default time duration between an execution instant of a first operation and the later execution instant of a second operation executed later in a memory element is now explained on the basis of FIG. 1.

For simplification of the illustration, the inventive concept is described starting from a 64-bit DRAM memory element, as it has already been exemplarily explained above. From the following explanations, however, it will become obvious that the inventive concept for the modification of the default time duration in a memory element is applicable to substantially all memory devices falling under the term memory elements, and in particular DRAM memory elements, wherein in particular an arbitrary number of memory cells and an arbitrary technology for the memory device may be chosen.

Figure 1A:
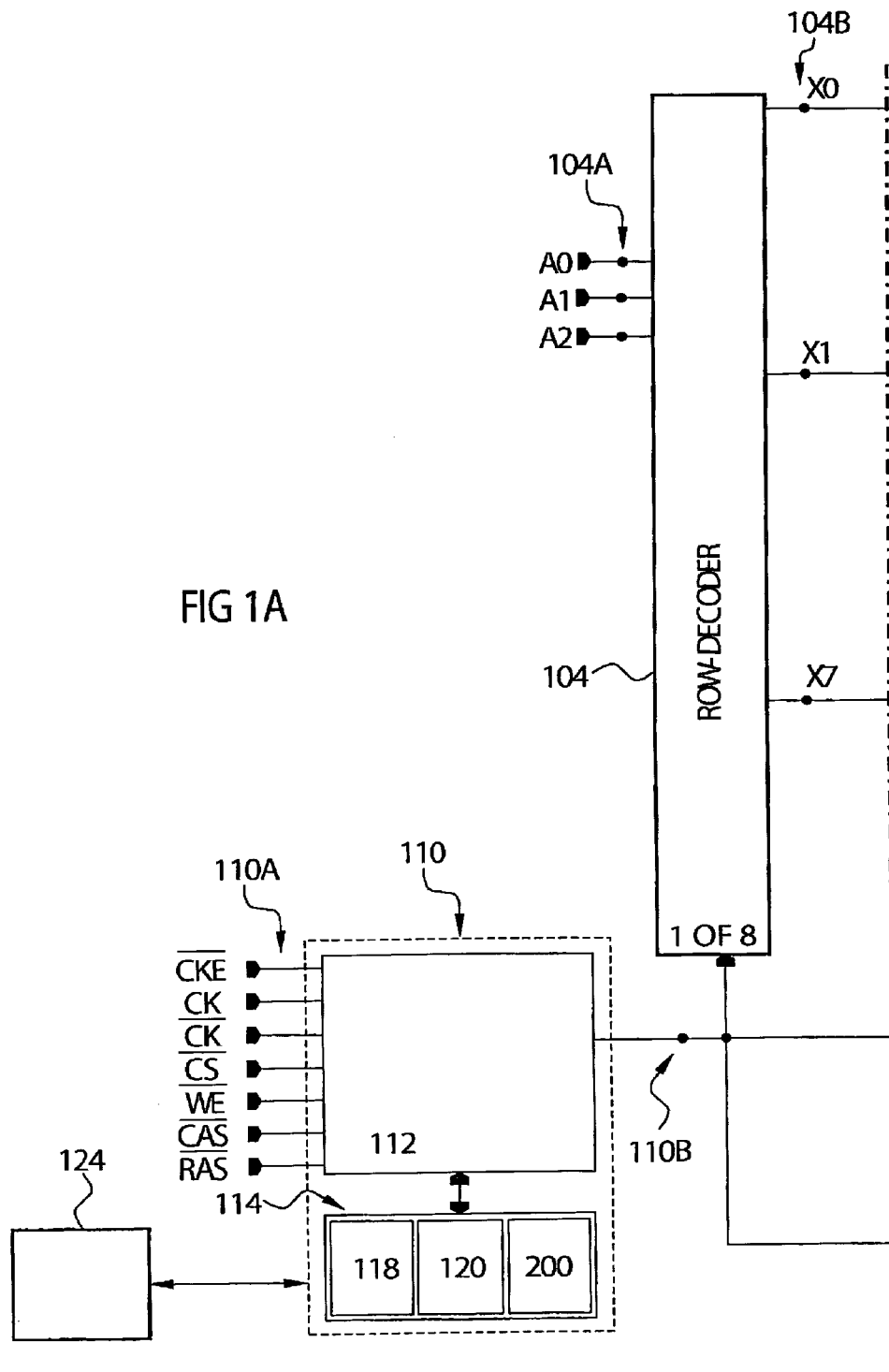
FIG. 1 including FIG. 1A
FIG. 1B shows a modified control logic means for a DRAM memory element according to a preferred embodiment of the present invention.

As illustrated in FIG. 1, the memory element 100 includes memory cells 102 with a storage capacitor 102a and an access transistor 102b, a row decoder 104 with a plurality of input terminals 104a (A0, A1, A2) and a plurality of output terminals 104b, a column decoder 106 with a plurality of input terminals 106a (A3, A4, A5) and a plurality of output terminals 106b, a sense amplifier 108 with a plurality of input terminals 108a and a plurality of input/output terminals 108b, and modified control logic means 110 with a plurality of input terminals 110a and a plurality of output terminals 110b.

It should be noted that the circuit block 108 designated as sense amplifier in FIG. 1 preferably also comprises an input/output controller for associating a data stream with reference to the individual memory cells 102, wherein this circuit block consisting of sense amplifier and input/output controller is further designated as sense amplifier 108 for the simplification of the further description.

The modified control logic means 110 according to the present invention comprises control logic means 112 and functionally associated execution instant modification means 114. The memory element 100 further comprises a plurality of word lines 104c (x0, x1, ... x7) connected to the output terminals 104b of the row decoder 104 and to the control terminals of the access transistor 102b of the memory cells 102, and a plurality of bit lines 108c (BL0, BL1, ... BL7) (bi-directional) connected to the input/output terminals 108b of the sense amplifier 108 and to the input/output terminals of the access transistors 102b of the memory cells 102. The memory element 100 further comprises a plurality of column activation lines 106c (y0 ... y7) connected between the output terminals 106b of the column decoder 106 and the input terminals 108a of the sense amplifier 108. The row decoder 104, the column decoder 106, and the sense amplifier 108 are connected to corresponding output terminals 110b of the modified control logic means 110.

The sense amplifier 108 (consisting of sense amplifier and input/output controller) further comprises an output terminal 108d (DATA-in/out) on which the data input/output signal Q of the sense amplifier 108 is present.

As illustrated in FIG. 1, the memory cells 102 include the storage capacitor 102a storing charge and the access transistor 102b transferring the charge into the storage capacitor 102a and out of it. In order to now write data into the individual memory cells 102 during the operation of the memory element 100, a predetermined voltage is applied to a word line 104c, so that the access transistor 102b connected to the word line 104c becomes conducting or the access transistors 102b connected to the word lines 104c become conducting. With this, the voltage supplied by the bit line 108c is written into the storage capacitor 102a of the respective memory cell 102.

In reading data from one or more of the memory cells, again a predetermined voltage is applied to one of the word lines 104c, to connect the corresponding access transistor(s) 102b through, so that the charge or voltage stored in the storage capacitor 102a may be read out on one of the bit lines 108c by means of the sense amplifier 108 and be provided at the output terminal 108d of the sense amplifier 108.

Corresponding to the designation RAM memory element (RAM=random access memory), in the write-read memory element 100 of FIG. 1, data may be stored and read out again in form of individual bits or patterns arbitrarily. As illustrated in the schematic construction of the 64-bit DRAM memory element 100 exemplarily illustrated in FIG. 1, the individual memory cells 102 are arranged in a matrix-shaped manner, wherein the memory cells 102 may each accommodate a data bit.

In FIG. 1 the memory contents of the memory cells 102 are entered as logic "0" values and "1" values in arbitrary distribution. The memory cells 102 may be individually addressed via the word lines 104c (x0 . . . x7) connected to the output terminals 104b of the row decoder 104 and via the bit lines 108c (BL0 . . . BL7) connected to the output terminals 108b of the sense amplifier 108. This takes place with an address $A_0 \ldots A_n$ by means of the row decoder 104 and by means of the column decoder 106 in connection with the sense amplifier 108. For the 8×8 matrix arrangement of the memory cells 102 exemplarily illustrated in FIG. 1, a 6-bit address is sufficient, wherein three bits for the row addressing ($A_0$, $A_1$, $A_2$) and three bits for the column addressing ($A_3$, $A_4$, $A_5$) each are employed.

Via the modified control logic means 110 with the output terminals 110b, the memory element 100 is now selectively adjusted to write or read operation and the individual memory cells 102 are addressed via the row decoder 104, the column decoder 106 and the sense amplifier 108, and the sense amplifier 108 is activated. A prerequisite for this is that for example the memory element 100 is set into operability, i.e. in a normal operation mode, via the input terminal 110a ($\overline{CS}$=Chip Select).

In FIG. 1, the inventive means 114 for providing a modified default time duration and its functional association with reference to the control logic means 112 is illustrated, together forming the inventive modified control logic means 110 for the memory element 100.

In order to be able to provide the modified default time duration according to the invention via the control logic means 112 to the memory element 100, the means 114 for providing a modified default time duration comprises the following functional units, means 118 for changing the default time duration during a test operation mode and a normal operation mode of the memory element 100, i.e. for changing the default time duration during the test operation mode in direction of the real time duration, to obtain a modified default time duration, and for changing the default time duration to execute the second operation offset by the modified default time duration after the execution instant of the first operation during a normal operation mode, means 120 for storing information on the modified default time duration, and means 200 for controlling the default time duration change means 118 during the test operation mode and during the normal operation mode.

The control means 200 controls the default time duration change means 118 by means of the information on the modified default time duration during the normal operation mode, wherein the control means 200 is also provided to control the default time duration change means 118 by means of an external test signal during the test operation mode.

The inventive means 114 for providing a modified default time duration is connected to for example externally arranged, functionally associated real time duration determination means 124 for the determination and/or provision of the real time duration in the memory element 100 preferably during a test operation mode of the memory element 100. The means 124 is provided to determine a real time duration in the memory element 100 between an execution instant of a second operation and the earlier execution instant of a first operation executed earlier in the memory element 100 during the test operation mode of the memory element 100.

The means 200 provided for controlling the default time duration change means 118 obtains as input signal the stored information on the modified default time duration from the storage means 120 during the normal operation mode and external information or control signals from the external test means 124 during the test operation mode. By means of the output signal provided from the control means 200, now the default time duration change means 118 and thus in the end also the means 114 for providing a modified default time duration is influenced (i.e. controlled) so that the optimized execution instants of the operations of the memory element 100 may be adjusted at suitably selectable instants during the normal and also the test operation mode.

The real time duration determination means 124 associated with the modified logic control means 110 thus determines a real time duration in the memory element 100 during a test operation mode, wherein the real time duration is chosen so that a performance parameter of the memory element 100 improves over a situation in which the default time duration between the execution instants of the first and second operations is used with the use of the real time duration between the execution instants of the first and second operations.

From the real time duration determination means 124 thus the ascertained real time duration in the memory element 100 is provided to the modified logic control means 110. By means of the inventive modified logic control means 110, i.e. by means of the means 114 for providing a modified default time duration, now the default time duration between an execution instant of a second operation and an earlier execution instant of a first operation executed earlier in the memory element 110 is suitably adjusted.

As illustrated in FIG. 1, the exemplarily externally associated real time duration determination means 124 is preferably embodied as semiconductor device testing means preferably in form of a wafer tester with a modified test software, which may also perform the ascertaining of the real time duration in the memory element 100 by means of a special test program during the usually performed wafer test of the semiconductor memory element 100, wherein, to this end, the memory element is in a test operation mode. The functioning and the functional association of the real time duration determination means 124 in form of a wafer tester and the association with the inventive modified logic control means 110 will be explained in detail in the following.

The default time duration of the memory element 100 defines the time interval between the two execution instants of two operations of the memory element 100. The default time duration here indicates a so-called "timing parameter" of the memory element 100, which is for example linked to the retention time, wherein various timing parameters are exemplarily illustrated in FIG. 5.

Figure 5:
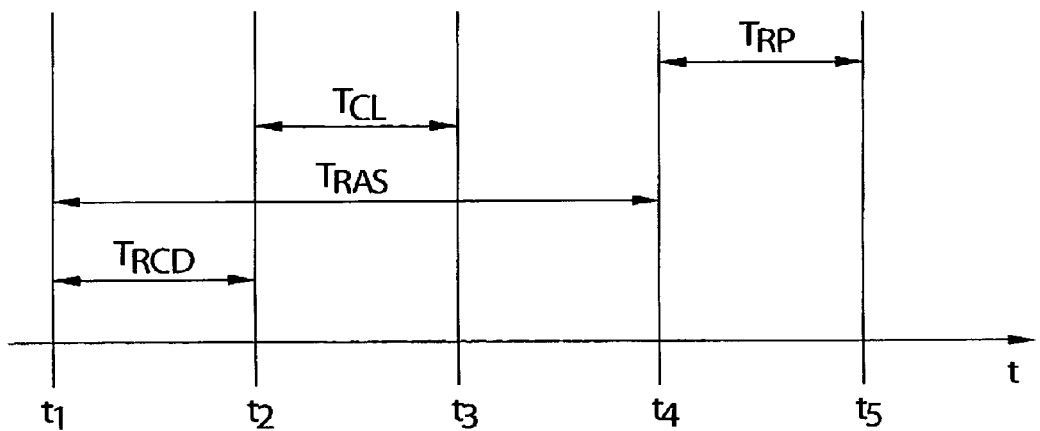
FIG. 5 shows a schematic time diagram overview for the illustration of the fundamental relations between typical execution instants of various operations of a memory element and the timing parameters of the memory element resulting therefrom according to the prior art.

With reference to the schematic overview of FIG. 5, typical operations in the memory element 100 are for example the activation of a word line of the memory element 100 at the instant $t_1$, a read-write access operation at the instant $t_2$, the switching on (activating) of the sense amplifier 108 for the bit line signals at the instant $t_3$, a deactivation operation of the word line (PRECHARGE) of the memory element 100 at the instant $t_4$, a write back operation of the memory information into the memory cells 102 of the memory element 100, and the activation of a word line (ACTIVE) in the same memory bank for a successive read-write access operation at the instant $t_5$, illustrated in FIG. 5. It should be noted that the above enumeration is no final enumeration of possible timing parameters to which the present invention is applicable.

As illustrated in FIG. 1, the various operations of the memory element 100, i.e. the respective execution instants of the operations, are defined by the control signals $S_M(t_n \pm \Delta t_n)$ present on the output terminals 110$b$, wherein the index M of the control signals $S_M$ is to indicate that different control signals may be passed to the various means 104, 106, 108 of the memory element 100. The variable $(t_n \pm \Delta t_n)$ represents the execution instant $t_n$ each modified by $(\pm \Delta t_n)$, with e.g. $t_n = t_1 \ldots t_5$, of the respective operation of the memory element 100. The time interval between the two execution instants of two operations of the memory element 100 thus indicates the (strictly speaking fixed) default time duration of the memory element 100. In practice, the default time duration of the memory element 100 is substantially fixedly default by the circuit layout and the production process of the memory element 100.

The temporal change $\Delta t_n$ indicates the temporal modification of the execution instant of one or also more operations of the memory element 100 by means of the control signals $S_M$ of the modified logic control means 110, so that the time interval between two execution instants of two operations of the memory element 100 may be changed so as to improve a performance parameter of the memory element 100. The time interval between two modified instants, i.e. for example the time interval between the execution instants $(t_1 \pm \Delta t_1)$ and $(t_2 \pm \Delta t_2)$, thus indicates a modified default time duration for the time interval between the two operations of the memory element 100, which matches the real time duration of the memory element 100 aimed at as closely as possible.

In order to be able to modify the default time duration, the memory element 100 is operable both in a test operation mode and in a normal operation mode. During the test operation mode, a real time duration in the memory element 100 is then determined by means of the test means 124. So preferably by means of a wafer tester that is for example embodied as a needle tester, the usual DRAM function tests are performed on wafer level after the procedural production of the semiconductor devices. In these DRAM function tests, for example test routines are performed with the integrated semiconductor circuits to ascertain defective semiconductor circuits, i.e. in particular defective DRAM memory cells. In order to replace these DRAM memory cells ascertained as defective by redundant memory cells arranged on the semiconductor wafer, for example connections on the semiconductor wafer are cut out by means of a laser to deactivate defective DRAM memory cells and to activate redundant DRAM memory cells as replacement.

During the examination of the DRAM memory elements arranged on the semiconductor wafer, according to the invention, now also the improved or optimal timing parameters, i.e. execution instants of the various operations, of the semiconductor memory elements are ascertained by means of suitable hardware or software arrangements in the wafer tester in the test operation mode. The information ascertained by the wafer tester with reference to improved or optimized timing parameters of the individual memory elements are then preferably stored in a read-only memory associated with the memory element, wherein a fuse element is preferably associated with the read-only memory. The memory content of the fuse element may now preferably be changed by means of a laser by cutting out the fuse element. The programming of the read-only memory may thus be preferably performed concurrently with the step in the production of the semiconductor devices, in which defective semiconductor memory cells are replaced by redundant semiconductor memory cells by means of a laser.

The real time duration indicates a time duration in the memory element 100 in which a performance parameter of the memory element 100 improves between the execution instants of the first and second operation over a situation, when the (fixedly default) default time duration between the execution instants of the first and second operations is used.

The performance parameter of the memory element to be improved may be an arbitrary function parameter of the memory element 100, which may be improved by the modification of the default time duration, such as a decrease of the access times, a decrease of the power consumption, an adaptation to certain clock frequencies, etc.

During the test operation mode of the memory element 100, the real time duration for the memory element 100 is thus ascertained by a temporal change of the execution instants of the operations of the memory element 100 via a change of the control signals $S_M(t_n \pm \Delta t_n)$, wherein the real time duration determination means 124 evaluates all data with reference to the real time duration, and thus with reference to improved or optimal execution instants of the operations, for example in form of the wafer tester, wherein the improved or optimal adjustment points may be ascertained by means of a hardware and/or software means associated with the tester 124.

The data ascertained by the real time duration determination means 124 with reference to the real time duration in the memory element 100 and with reference to optimized execution instants of the operations in the memory element 100 are provided to the modified control logic means 110 and thus the means 114 for providing a modified default time duration for the memory element 100.

Then the default time duration is changed in direction of the ascertained real time duration by means of the means 118 to obtain a modified default time duration. The modified default time duration should match the real time duration as closely as possible or should, in the ideal case, be selected as identically as possible with the real time duration (as far as this can be realized in practice).

A possible technical realization of the means 118 for changing the default time duration as part of the default time duration modification means 114 within the modified control logic means 110 is now subsequently explained in detail.

The means 118 for changing the default time duration in direction of the real time duration to obtain the modified default time duration now consists of circuit elements being switched in the signal path of the control signals for the operations or circuit elements being bridged in the signal path to change the execution instants of the respective operations, i.e. to execute the operations a certain time duration before or after the default time duration. Here, it is attempted that the modified default time duration finally matches the ascertained real time duration as exactly as possible.

This is preferably performed during the test operation mode of the memory element 100.

In order to change the default time duration in default steps to obtain for example later execution instants $(t_n + \Delta t_n)$ of the operations, delay elements for example in form of additional circuit elements are connected additionally for the extension of the signal runtimes of the control signals $S_M(t_n+\Delta t_n)$ to obtain a modified default time duration. In order to shorten the signal runtimes of the control signals $S_M(t_n-\Delta t_n)$ to obtain for example earlier execution instants $(t_n-\Delta t_n)$ of the operations, corresponding delay elements in the means 118 are bridged or changed so as to obtain a modified default time duration. The temporal divisions or steps by which the default time duration may be changed depend on the number and the dimensioning of the delay elements. Thus, for example a certain temporal quantization of the temporal adjustment steps results.

If the modified default time duration matching the desired real time duration in the memory element as exactly as possible was now obtained, information on the modified default time duration is stored in a read-only memory, such as in fuse circuits, by means of the means 120 during the testing or after the testing.

During the normal operation mode of the memory element 100 this information is now provided to the default time duration modification means 114 and in particular to the means 200, so that the second operation may be executed offset by the modified default time duration after the execution instant of the first operation, so that the desired improvement of an operation or function parameter of the memory element 100 is obtained.

The improved function parameter of the memory element 100 may for example be to decrease the access time of the memory element, to decrease the power consumption of the memory element and/or to suitably adjust the timing parameters, etc.

It should be noted that it is of course also possible, with the present invention, to determine a real time duration in the memory element during the test operation mode so that the mutual interactions of several performance parameters or function parameters of the memory element 100 are taken into account among each other.

In the following, it is now exemplarily gone into the various timing parameters of memory devices in connection with the present invention in detail for the elucidation of the inventive concept.

As already indicated above, one of the substantial timing parameters of memory devices is the parameter $T_{RCD}$ (active to read or write delay) that determines the time spacing between the activation of a word line (ACTIVE) and the subsequent read or write command (READ or WRITE).

Memory devices comprising a relatively quick $T_{RCD}$ parameter may be put in a quicker velocity category and thereby for example accomplish a higher selling price. The time duration $T_{RCD}$ indicated above is ascertained, among other things, by the waiting time between the actual activation of the word line of the memory element 100 and the switching on of the sense amplifier 108 for the bit line signals. This waiting time is for example met by means of an integrated timer circuit in the modified control logic means 110, which switches the sense amplifiers 108 on only when it is ensured that the signal transfer from an addressed memory cell 102 to the bit line 108c is largely completed.

If the sense amplifier 108 (consisting of sense amplifier and input/output controller) is switched on too early, then the memory cell 102 is not yet completely read out. This means that the sense amplifier 108 obtains a reduced input signal, which may for example lead to a read error or may also cause a deterioration of the so-called retention time duration.

DRAM memory cells 102 comprising a storage capacitor for charge or information storage tend to loose parts of the stored charge within a determined time duration due to leakage currents. Therefore each memory cell 102 has to be refreshed within a certain default refresh interval, i.e. brought to its full voltage value again. The retention time duration of the DRAM memory element 100 indicates that time duration over which the memory cells 102 may maintain enough charge so that then a correct read operation by the sense amplifiers 108 is still possible. The retention time duration of the DRAM memory element 100 thus has to be at least so great that the memory cells 102 can hold enough charge during the time duration. But if in the read operation only part of the charge stored in the memory cell 102 is used, the retention time duration of the memory element 100 and thus a substantial performance parameter of the memory element 100 is reduced, which may be modified and optimized by means of the above-described test operation mode by adjusting the $T_{RCD}$ time duration suitably.

A further substantial timing parameter of memory devices represents the $T_{RP}$ time duration determining the temporal distance between the deactivation of a word line (PRECHARGE) of a memory cell 102 and a subsequent activation of a word line (ACTIVE) in the same memory bank. The time duration $T_{RP}$ is substantially limited by the time duration necessary to switch off the word line and to then bring the bit lines 108c to an exactly equal mean voltage value. It has to be waited with the switching off of the word line, however, as long as the cell information, i.e. the voltage level, corresponding to a logic "1" or "0" value has been completely written back into the memory cell 102. This writing back is started immediately after the read and write access operation and requires relatively much time. If now the word line is switched off too early, not the complete cell information, i.e. a complete "1" or "0" voltage, is written back into the memory cell 102, which may lead to a total failure of the memory cell 102 or to a deterioration of the retention time duration.

If the word line, however, is switched off later than required, thus this timing parameter, i.e. the time duration $T_{RP}$, deteriorates. Thus, the time duration $T_{RP}$ represents a further important performance parameter for the memory element 100, so that it becomes obvious that the optimizing of the switch-off time of the word line is very important for the functioning of a DRAM memory element. This optimal adjustment may again be made during the test operation mode of the memory element 100 by means of the inventive default time duration modification means 114.

A further substantial timing parameter is the time duration $T_{RAS}$ determining the temporal distance between the activation of a word line (ACTIVE) and the deactivation of this word line (PRECHARGE). It becomes obvious that the time duration $T_{RAS}$ is strongly dependent on the time duration $T_{RCD}$ and $T_{RP}$. Due to the interaction between the various timing parameters, the timing parameter $T_{RAS}$ may thus also be adjusted for example via a change of one of the timing parameters $T_{RCD}$ or $T_{RP}$.

In the following, now a possible technical realization of a read-only memory evaluating circuit 200 for the modified control logic means 110 is described on the basis of FIG. 2, wherein the read-only memory evaluating circuit 200 is provided to evaluate the information stored in a read-only memory element with reference to the change and modification of the default time duration and to pass it on to the means 118 for changing the default time duration or to generate an output signal with which the means 118 may be influenced or controlled to modify the control signals $S_M(t_n\pm\Delta t_n)$.

Figure 2:
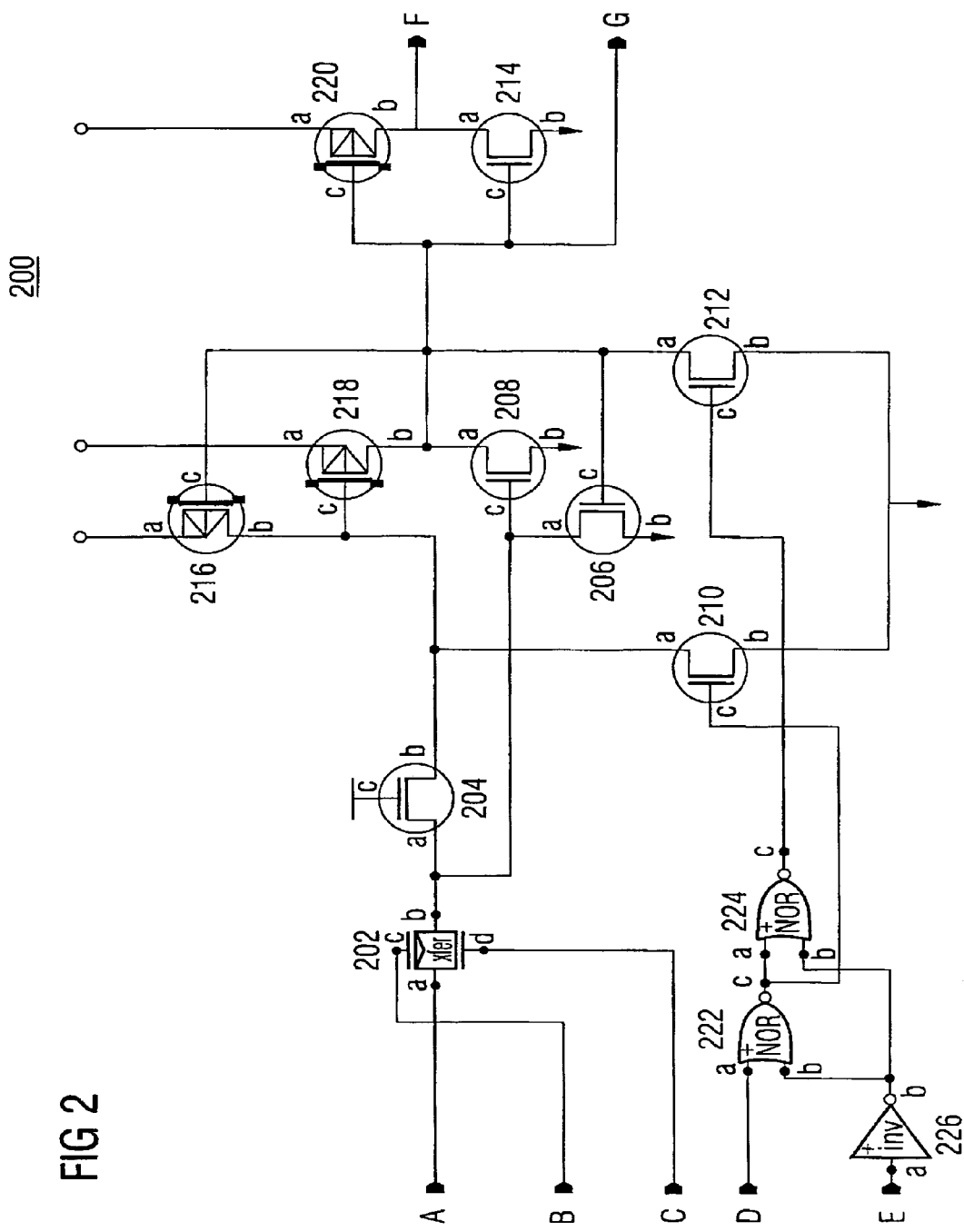
FIG. 2 shows a possible realization of a read-only memory evaluating circuit (fuse evaluating circuit) for the modified control logic means according to the preferred embodiment of the present invention.

The read-only memory evaluating circuit 200 includes transfer gate means 202 with an input terminal 202a, an output terminal 202b, a first control terminal 202c and a second control terminal 202d, a first n-type transistor 204 that is only provided for a level conversion (between input signal and output signal) in the embodiments illustrated in FIG. 2 but is not substantial for the inventive idea, with a first terminal 204a, a second terminal 204b, and a control terminal 204c, a second n-type transistor 206 with a first terminal 206a, with a second terminal 206b, and with a control terminal 206c, a third n-type transistor 208 with a first terminal 208a, a second terminal 208b, and a control terminal 208c, a fourth n-type transistor 210 with a first terminal 210a, a second terminal 210b, and a control terminal 210c, a fifth n-type transistor 212 with a first terminal 212a, a second terminal 212b, and a control terminal 212c, a sixth n-type transistor 214 with a first terminal 214a, a second terminal 214b, and a control terminal 214c, a first p-type transistor 216 with a first terminal 216a, a second terminal 216b, and a control terminal 216c, a second p-type transistor 218 with a first terminal 218a, a second terminal 218b, and a control terminal 218c, a third p-type transistor 220 with a first terminal 220a, a second terminal 220b, and a control terminal 220c, first NOR gate means 222 with a first input terminal 222a, a second input terminal 222b, and an output terminal 222c, second NOR gate means 224 with a first input terminal 224a, a second input terminal 224b, and an output terminal 224c, and inverter means 226 with an input terminal 226a and an output terminal 226b.

The input terminal 202a of the transfer gate means 202 forms a first input terminal of the read-only memory evaluating circuit 200 to which a first input signal A can be applied. A second and a third input signal B, C can be applied to the first and the second control terminal 202c, 202d of the transfer gate means 202. The first input terminal 202a of the NOR gate means 222 forms a fourth input terminal of the read-only memory evaluating circuit 200 to which a fourth input signal D from a read-only memory means, preferably a fuse circuit, can be applied. The input terminal 226a of the inverter means forms a fifth input terminal to which a fifth input signal E can be applied. The second terminal 220b of the third p-type transistor 220 forms the first output terminal of the read-only memory evaluating means 220 at which a first output signal F can be tapped. The second terminal 218b of the second p-type transistor 218 forms the second output terminal of the read-only memory evaluating means 200 at which a second output signal G can be tapped, wherein the output signal G corresponds to the inverted first output signal F.

The second terminal 202b of the transfer gate means 202 is connected to the first terminal 204a of the first n-type transistor 204, to the control terminal 208c of the third n-type transistor 208, and to the first terminal 206a of the second n-type transistor 206. The second terminal 206b of the second n-type transistor 206 and the second terminal 208b of the third n-type transistor 208 are connected to a reference potential, e.g. ground potential. The second terminal 204b of the first n-type transistor 204 is connected to the first terminal 210a of the fourth n-type transistor 210, to the control terminal 218c of the second p-type transistor 218, and to the second terminal 216b of the first p-type transistor 216. The first terminal 216a of the first p-type transistor 216 and the first terminal 218a of the second p-type transistor 218 and the first terminal 220a of the third p-type transistor 220 are connected to reference potentials, e.g. supply voltages.

The control terminal 216c of the p-type transistor 216 is connected to the second terminal 218b of the second p-type transistor 218, to the first terminal 208a of the third n-type transistor 208, to the control terminal 220c of the third p-type transistor 220, to the control terminal 214c of the sixth n-type transistor 214, to the control terminal 206c of the second n-type transistor 206, and to the first terminal 212a of the fifth n-type transistor 212. The second terminals 210b and 212b of the fourth and fifth n-type transistors 210 and 212 are connected to ground potential. The second terminal 226b of the inverter means 226 is connected to the second terminal 222b of the first NOR gate means 222 and to the second terminal 224b of the second NOR gate means 224. The output terminal 222c of the first NOR gate means 222 is connected to the first terminal 224a of the second NOR gate means 224 and to the control terminal 210c of the fourth n-type transistor 210. The output terminal 224c is connected to the control terminal 212c of the fifth n-type transistor 212.

In the following, now the functioning of the read-only memory evaluating means 200 (fuse circuit evaluating means) illustrated in FIG. 2 is described in detail.

The second p-type transistor 218 and the third n-type transistor 208 form a latch circuit 228 with the first p-type transistor 216 and the n-type transistor 206 operating as holding inverter means. The third p-type transistor 220 and the sixth n-type transistor 214 each form output driver means.

In connection with the first n-type transistor 204, the read-only memory evaluating means 200 illustrated in FIG. 2 also works as a level converter, which is, however, not substantial for the inventive concept.

The read-only memory evaluating means 200 illustrated in FIG. 2 may thus be operated both in the normal operation mode and the test operation mode.

In the following, it is gone into the normal operation mode, i.e. the test operation mode is switched off. This is achieved by the second input signal B having a high logic level ("1"), the third input signal C having a low logic level ("0"), and the fifth input signal E having a high logic level ("1"). Thus, the transfer gate means 202 is inhibited, the fifth input signal E goes to a logically high value "1" and activates the signal D (D=enabled), which means that the fourth input signal D determines the output signals F and G, the first and the second output signal F, G of the read-only memory evaluating means 200. The fourth input signal D present at the first input terminal 222a of the first NOR gate means 222 is a signal from the read-only memory means, preferably from a fuse circuit.

If the fuse element in the fuse circuit is not disconnectd, the fourth output signal D has a low logic level ("0"), but if the fuse element in the fuse circuit is disconnectd ("fused"), the fourth input signal D has a high logic level ("1"). If the fourth input signal D has a logically high level (D=1) when the fifth input signal E has a high logic level (E=1), i.e. if for example the fuse element is "fused", the fifth n-type transistor 212 switches through between its first and its second terminal 212a and 212b, so that the signal F present on the first output terminal 220b of the read-only memory evaluating means 200 transitions to a logically high level (F=1). But if the fourth input signal D has a low logic level (D=0), the first output signal F correspondingly transitions to a low logic level (F=0). Therefrom results:

If $D=0 \rightarrow F=0, G=1$;

If $D=1 \rightarrow F=1, G=0$

Via the fuse state in the various fuse circuits, the output signals of the read-only memory evaluating means 200 may thus be fixedly adjusted to a high or low logic value in the normal operation mode of the memory element 100.

It should be noted that a read-only memory evaluating means 200 is associated with every individual read-only memory element, i.e. every individual fuse element, to adjust the output signal F each dependent on the state of the fuse element in the normal operation mode.

In the following, it is now gone into the test operation mode of the memory element 100 of FIG. 1 with reference to the read-only memory evaluating means 200 of FIG. 2.

During the test operation mode, the second input signal B and the fifth input signal E have a low logic level ("0"), wherein the third input signal C of the read-only memory evaluating means 200 has a high logic level "1". The fifth input signal E operating as test operation mode signal and having a low logic level during the test operation mode switches the output signals at the output terminals 222c and 224c of the NOR gate means 222 and 224 to a low logic level, so that the fourth n-type transistor 210 and the fifth n-type transistor 212 are inhibited, so that the state of the fourth input signal D associated with the read-only memory elements, i.e. the fuse elements, is now without meaning for the output signal F or G. Thus, the fourth input signal D is disconnected from the read-only memory elements.

By means of the fifth input signal E present at the input terminal 206a of the inverter means 226, thus the fourth input signal D is logically disconnected from the read-only memory evaluating means 200 (if the fifth input signal E has a logic 0 value in the test operation mode), so that the first output signal F may be programmed in the test operation mode with the aid of the second and the third input signal B and C operating as activation of the transfer gate means as well as with the aid of the first input signal A with which a logic 0 value or a logic 1 value may be fed in.

The test operation mode signals C and B (second and third input signal) switch the transfer gate means 202 on, so that the first input signal A comes through the transfer gate means 202 and determines the first and the second output signal F, G of the read-only memory evaluating means, wherein applies:

If $A=0 \Leftrightarrow F=0, G=1$;

If $A=1 \Leftrightarrow F=1, G=0$

During the test operation mode of the memory element 100 the output signals of the read-only memory evaluating means 200 may thus be set either to a high or a low logic level via the first input signal A of the read-only memory evaluating means 200 so as to determine a modified execution instant for one or more operations of the memory element 100, as this is still explained in detail in the following. This is for example performed during the test operation mode by the testing means 124. Correspondingly, the input signals A, B, C, and E may be provided during the test operation mode by the testing means 124, while the fourth input signal D is associated with a read-only memory element (fuse element).

Now there is a plurality of read-only memory evaluating circuits 200 in the DRAM memory element 100, wherein preferably an accompanying fuse circuit with a fuse element is associated with each read-only memory evaluating means 200.

For the adjustment of the modified default instant in the DRAM semiconductor memory element 100 of FIG. 1, in order to optimize for example the $T_{RCD}$ timing parameter of the memory element 100, there are for example five read-only memory evaluating circuits 200 and five accompanying fuse circuits.

With each output signal F or G of the read-only memory evaluating circuit 200, one of the control signals $S_M(t_n \pm \Delta t_n)$ may be either delayed or accelerated for a corresponding operation of the memory element 100, such as the signal causing the switch-on of the sense amplifier 108.

Figure 3A:
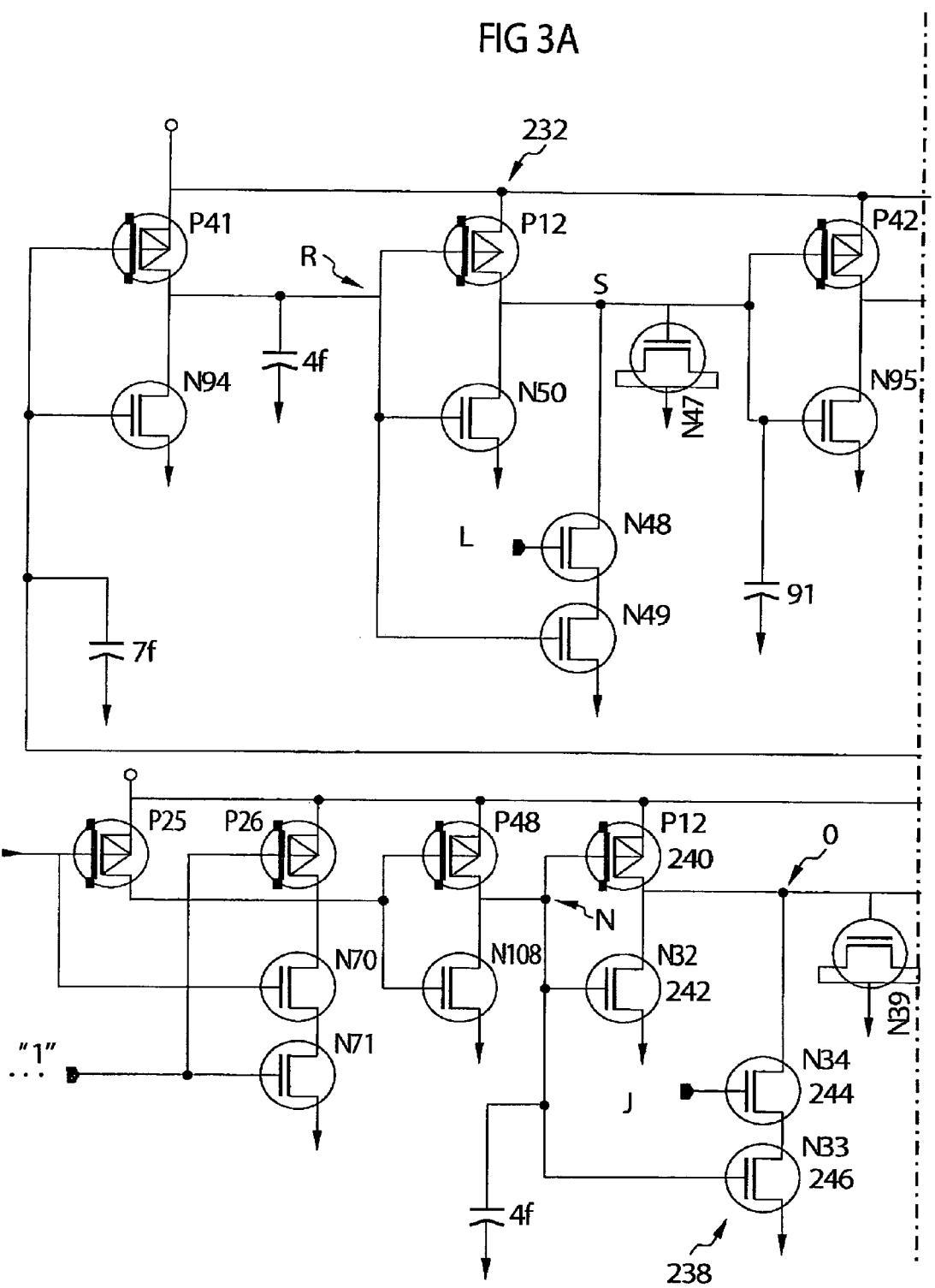
FIG. 3 including FIG. 3A
FIG. 3B shows a possible realization of a means for changing the default time duration for the modified control logic means according to the preferred embodiment of the present invention.
Figures 4, 4A:
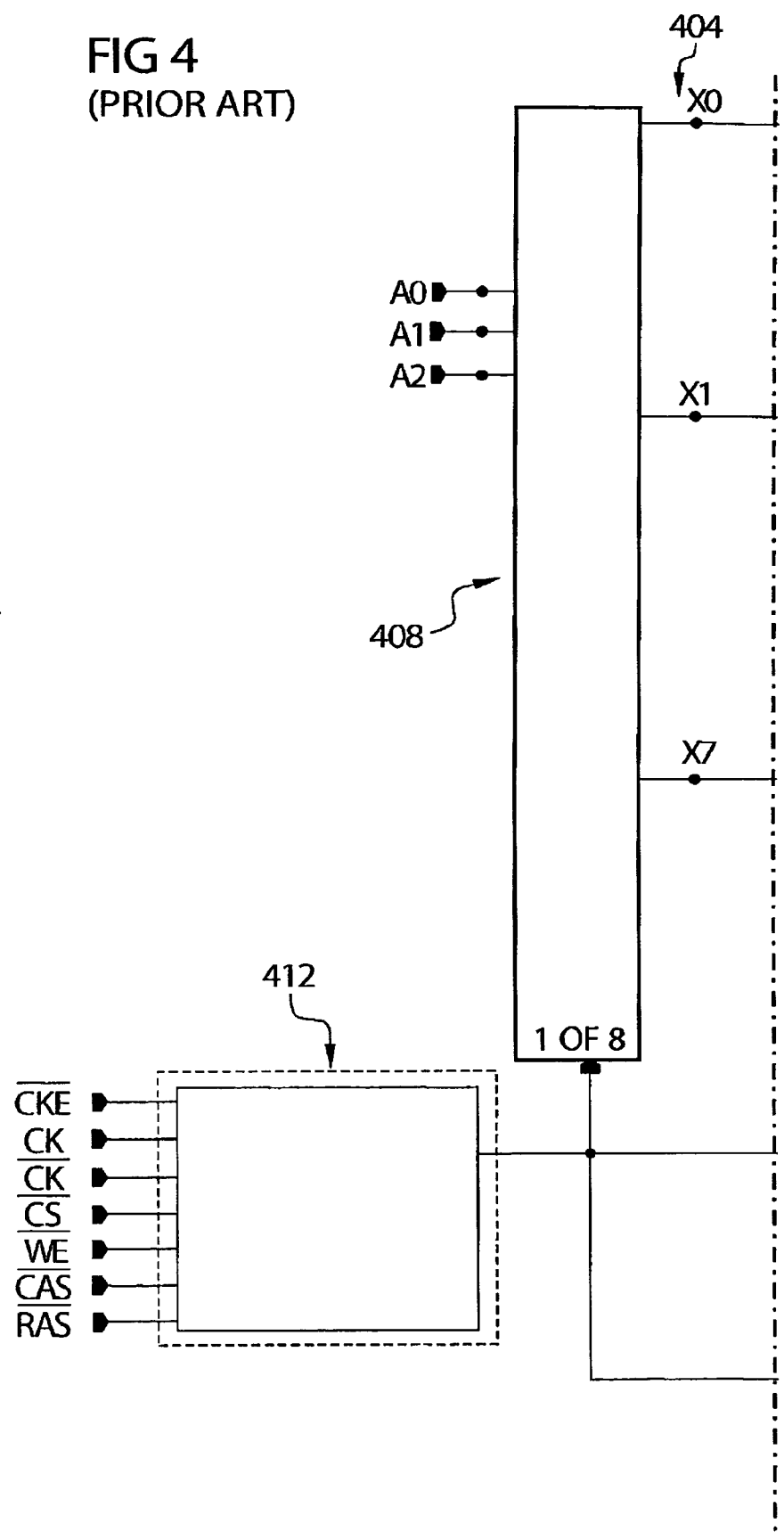
FIG. 4 including FIG. 4A

An example for such a signal that may be accelerated or delayed via corresponding control signals from the means 200 is shown in the circuit arrangement 118 exemplarily illustrated on the basis of FIG. 3 for changing the default time duration.

The (sixth) input signal H generates an output signal OUT corresponding to an arbitrary control signal $S_M(t_n \pm \Delta t_n)$ for an arbitrary operation of the memory element 100. The input signal H first comes to the inverter stage 238 comprising the p-type transistor 240 (P12) and the n-type transistor 242 (N32) and then via several inverter stages designated with the reference numerals 230, 232, 234, 236 to the output OUT, so that the signal finally present at the output OUT is influenced by the inverter means 230–238. If the input terminal of the inverter means 238 (node "N") goes to a logically high level, the node "0" is discharged via the n-type transistor 242. The velocity with which the node "0" is discharged, however, decisively depends on the seventh input signal I.

If the seventh input signal I has a logically high level, the node "0" is not only discharged via the n-type transistor 242 but additionally via the n-type transistor 244, 246 (N33, N34). If the seventh input signal I has a high logically high level, the control signal H thus runs through the inverter stage 238 more quickly. But if the seventh input signal I has a low logic level, the control signal H runs through the inverter stage more slowly.

The corresponding applies for the further input signals K, L, M. If now the input signals I, K, L, M are replaced by corresponding output signals F or H of the change circuit 200, i.e. depending on whether it is intended to accelerate or delay the output signal OUT with reference to the sixth input signal H, an output signal Out is obtained, which may be adjusted in the normal operation mode of the memory element 100 via the fuse elements and which may be adjusted in the test operation mode via the first input signal A of the read-only memory evaluating means 200. As already indicated, the input signal A (and also the further input signals B, C and E), of the read-only memory evaluating means 200 may be provided by the testing means 124 during the test operation mode.

Since the output signal OUT (i.e. the rising edge) for example switches on the evaluation, i.e. the modification of the default time duration, in the DRAM memory element 100, the modified default instant may thus be adjusted, the various execution instants of the various operations of the DRAM memory element and thus for example the $T_{RCD}$ parameter may be adjusted.

Summing up, it can thus be established that the use of read-only memory means preferably formed in the form of fuse elements for the adjustment of the timing parameters of a DRAM memory element enables an extremely fast, accurate, flexible and inexpensive adjustment of the timing parameters and the retention time of the memory element in particular after previous ascertaining of the optimal adjustment points in a test operation mode of the DRAM memory element.

Since fuse elements may be fused within seconds, a very fast adjustment of the timing parameters may be made. Since the production parameters of DRAM memory elements are subject to constant variations, whereby the optimum adjustment points of the above-mentioned timing parameters also constantly vary, the timing parameters may always be adapted to the instantaneously achievable values extremely accurately by the inventive concept. Here, also the mutual interaction of the various parameters among each other may be taken into account.

The inventive concept for adjusting the various function parameters of a memory device by means of fuse elements also has a decisive cost advantage, because on the one hand no costly new layout for adapted circuit arrangement has to be realized, wherein the greatest cost advantage, however, results from the time advantage, i.e. from the fast adjustment possibility and thus from the possibility of quickly reacting to production variations.

It is extremely advantageous in the inventive concept that the inventive method for modifying a default time duration in a memory element during the test operation mode of the memory element by means of a semiconductor device testing means, such as in form of a wafer tester, may be performed still on wafer level, wherein in particular the steps of ascertaining the improved execution instants of the timing parameters of the memory element and storing the information on the modified default time duration in an associated read-only memory in form of fuse elements may be performed in connection with the operation of a wafer tester.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for modifying a default time duration between an execution instant of a second operation and the earlier execution instant of a first operation executed earlier in a memory element, wherein the memory element is operable in a test operation mode and a normal operation mode, comprising:
    providing a real time duration in the memory element during the test operation mode, wherein the real time duration is chosen so that a performance parameter of the memory element, when using the real time duration between the execution instants of the first and second operations, improves over a situation in which the default time duration between the execution instants of the first and second operations is used,
    changing the default time duration in direction of the real time duration during the test operation mode to obtain a modified default time duration,
    storing information on the modified default time duration in the memory element during the test operation mode, and
    executing the second operation offset by the modified default time duration after the execution instant of the first operation during the normal operation mode.

2. The method of claim 1, wherein the information on the ascertained time duration is stored in a read-only memory.

3. The method of claim 2, wherein the read-only memory comprises a fuse element.

4. The method of claim 1, wherein the step of providing the real time duration and/or the step of storing the information is performed by means of semiconductor device testing means.

5. The method of claim 4, wherein the semiconductor device testing means is external testing means.

6. The method of claim 4, wherein the semiconductor device testing means performs a step of determining the real time duration in the memory element.

7. The method of claim 1, wherein the memory element comprises a plurality of memory cells and an associated sense amplifier, wherein each memory cell comprises a bit line for reading in-out data and a word line for activating/deactivating the memory cell.

8. The method of claim 7, wherein the first and/or second operation is chosen from the following group of operations: activation of a word line of the memory element, read-write access operation of the memory element, switch-on operation of the sense amplifier for the bit line signals, deactivation of the word line (PRECHARGE), writing back the memory information into the memory element, reactivation of a word line (ACTIVE) in the same memory bank.

9. The method of claim 1, wherein the performance parameters are the power consumption, timing parameters and/or the access time of the memory element.

10. The method of claim 1, wherein the step of providing the real time duration is performed taking mutual interactions among several performance parameters into account.

11. The method of claim 1, wherein the default time duration is modified in default steps to obtain the modified default time duration.

12. The method of claim 1, wherein the modified default time duration deviates a minimum residual time duration from the real time duration, wherein the minimum residual time duration is the minimally achievable time difference between the modified default time duration and the real time duration.

13. The method of claim 1, wherein the modified default time duration matches the ascertained real time duration.

14. A semiconductor memory element with a plurality of memory cells and control logic means for controlling execution instants of operations of the semiconductor memory element, comprising:
    means for providing a modified default time duration between an execution instant of a second operation and an earlier execution instant of a first operation executed earlier in the memory element depending on an ascertained real time duration in the memory element,
    wherein the real time duration is chosen so that a performance parameter of the memory element, when using the ascertained real time duration between the execution instants of the first and second operations, improves over a situation in which the default time duration between the execution instants of the first and second operations is used, and
    wherein information on the modified default time duration is stored in the means for providing a modified default time duration.

15. The semiconductor memory element of claim 14, wherein the memory element is operable in a normal operation mode, wherein the means for providing a modified default time duration comprises:
    means for changing the default time duration to execute the second operation offset by the modified default time duration after the execution instant of the first operation during the normal operation mode, means for storing the information on the modified default time duration, and means for controlling the default time duration change means during the normal operation mode by means of the stored information on the modified default time duration.

16. The semiconductor memory element of claim 14, wherein the memory element is further operable in a test operation mode, wherein the default time duration change means is further provided to change the default time duration during the test operation mode in direction of the real time duration to obtain the modified default time duration, and wherein an external control signal can be fed to the control means during the test operation mode, so that the default time duration change means is controllable by means of the external control signal during the test operation mode.

17. The semiconductor memory element of claim 14, wherein the information on the ascertained time duration is stored in a read-only memory.

18. The semiconductor memory element of claim 17, wherein the read-only memory comprises a fuse element.

19. The semiconductor memory element of claim 14, wherein the memory element comprises a plurality of memory cells and an associated sense amplifier, wherein each memory cell comprises a bit line for reading in/out data and a word line for activating/deactivating the memory cell.

20. The semiconductor memory element of claim 19, wherein the first and/or second operation is chosen from the following group of operations: activation of a word line of the memory element, read-write access operation of the memory element, switch-on operation of the sense amplifier for the bit line signals, deactivation of the word line (PRE-CHARGE), writing back the memory information into the memory element, reactivation of a word line (ACTIVE) in the same memory bank.

21. The semiconductor memory element of claim 14, wherein the performance parameters are the power consumption, timing parameters and/or the access time of the memory element.

22. The semiconductor memory element of claim 14, wherein the means for providing a modified default time duration takes mutual interactions of several performance parameters into account.

23. The semiconductor memory element of claim 14, wherein the default time duration is modified in default steps to obtain the modified default time duration.

24. The semiconductor memory element of claim 14, wherein the modified default time duration deviates a minimum residual time duration from the real time duration, wherein the minimum residual time duration is the minimally achievable time difference between the modified default time duration and the real time duration.

25. The semiconductor memory element of claim 14, wherein the modified default time duration matches the ascertained real time duration.

* * * * *

UNITED STATES PATENT AND TRADEMARK OFFICE
CERTIFICATE OF CORRECTION

PATENT NO. : 7,072,233 B2
APPLICATION NO. : 10/850817
DATED : July 4, 2006
INVENTOR(S) : Brede et al.

It is certified that error appears in the above-identified patent and that said Letters Patent is hereby corrected as shown below:

Column 19, Line 43: Delete "If $A=0 < F=0$, $G=1$;" and insert --If $A=0 \longrightarrow F=0$, $G=1$;--.
Column 19, Line 45: Delete "If $A=1 < F=1$, $G=0$" and insert --If $A=1 \longrightarrow F=1$, $G=0$--.

Signed and Sealed this

Seventeenth Day of October, 2006

JON W. DUDAS
*Director of the United States Patent and Trademark Office*